(12) United States Patent
Sakai et al.

(10) Patent No.: US 10,871,709 B2
(45) Date of Patent: Dec. 22, 2020

(54) IMPRINT APPARATUS AND METHOD OF MANUFACTURING ARTICLE

(71) Applicant: CANON KABUSHIKI KAISHA, Tokyo (JP)

(72) Inventors: Katsutoshi Sakai, Utsunomiya (JP); Tadashi Hattori, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 197 days.

(21) Appl. No.: 15/637,421

(22) Filed: Jun. 29, 2017

(65) Prior Publication Data
US 2018/0017863 A1    Jan. 18, 2018

(30) Foreign Application Priority Data

Jul. 12, 2016  (JP) .................... 2016-137957

(51) Int. Cl.
| | | |
|---|---|---|
| G03F 7/00 | (2006.01) | |
| B29C 33/42 | (2006.01) | |
| B29C 59/02 | (2006.01) | |
| H01L 21/027 | (2006.01) | |
| B29C 43/58 | (2006.01) | |
| B29L 7/00 | (2006.01) | |

(52) U.S. Cl.
CPC .......... *G03F 7/0002* (2013.01); *B29C 33/424* (2013.01); *B29C 59/02* (2013.01); *H01L 21/027* (2013.01); *B29C 43/58* (2013.01); *B29L 2007/002* (2013.01)

(58) Field of Classification Search
CPC .............. B29C 43/58; B29C 2043/025; B29C 2043/585; B29C 2043/5808; B29C 2043/5891; G03F 9/7038; G03F 9/7088; G03F 7/0002; B29K 2105/0058
See application file for complete search history.

(56) References Cited

U.S. PATENT DOCUMENTS

| | | |
|---|---|---|
| 9,400,426 B2 | 7/2016 | Hamaya et al. |
| 2009/0140445 A1* | 6/2009 | Lu .................... B29C 43/003 264/40.1 |

(Continued)

FOREIGN PATENT DOCUMENTS

| | | |
|---|---|---|
| JP | 2011114309 A | 6/2011 |
| JP | 2013070023 A | 4/2013 |

(Continued)

*Primary Examiner* — Michael M. Robinson
(74) *Attorney, Agent, or Firm* — Rossi, Kimms & McDowell LLP

(57) ABSTRACT

The present invention provides an imprint apparatus which forms a pattern of an imprint material on a substrate by using a mold, the apparatus including a mold holding unit configured to hold the mold, a substrate holding unit configured to hold the substrate, an image capturing unit configured such that a field of view of the image capturing unit includes a pattern region of the mold held by the molding unit, and a control unit configured to determine, based on an image obtained by capturing at least one of the mold and the substrate by the image capturing unit after a mold separating operation for separating the mold from a cured imprint material on the substrate, whether an abnormality is generated in the mold separating operation.

10 Claims, 7 Drawing Sheets

(56) References Cited

U.S. PATENT DOCUMENTS

| | | | | |
|---|---|---|---|---|
| 2010/0314798 | A1* | 12/2010 | Kawakami | B82Y 10/00 |
| | | | | 264/293 |
| 2012/0261849 | A1* | 10/2012 | Hashimoto | G03F 7/0002 |
| | | | | 264/21 |
| 2016/0052179 | A1 | 2/2016 | Murayama | |

FOREIGN PATENT DOCUMENTS

| | | |
|---|---|---|
| JP | 2015115370 A | 6/2015 |
| JP | 2016062972 A | 4/2016 |

\* cited by examiner

FIG. 8

| IMAGE | ADSORPTION PRESSURE | | |
|---|---|---|---|
| | WITH ABNORMALITY | WITHOUT ABNORMALITY | |
| DARK | DECHUCKING | DRIVING ABNORMALITY | |
| BRIGHT | ABNORMALITY IN SUBSTRATE HOLDING | NORMAL | |

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

As a request for micropatterning of a semiconductor device, a MEMS, or the like increases, an imprint technique capable of forming a fine pattern (structure) of several nm order on a substrate is attracting attention, in addition to a conventional photolithography technique. The imprint technique is a microfabrication technique of supplying (applying) an uncured imprint material onto the substrate, bringing the imprint material and a mold (die) into contact with each other, and forming, on the substrate, the pattern of the imprint material corresponding to a fine three-dimensional pattern formed on the mold.

In the imprint technique, there is a photo-curing method as one type of a method of curing imprint materials. The photo-curing method is a method of curing the imprint material supplied to a shot region on the substrate by irradiating it with light in a state in which the imprint material and the mold are brought into contact with each other, and separating the mold from the cured imprint material, thereby forming the pattern of the imprint material on the substrate.

In an imprint apparatus which adopts the imprint technique, a large stress is momentarily applied to the interface between the mold and the cured imprint material on the substrate (a surface on which the mold and the imprint material are in contact with each other) when the mold is separated from the imprint material. Such a stress generates a distortion in the pattern of the imprint material formed on the substrate and causes a pattern defect. Additionally, because of such a stress, it becomes impossible to separate the mold from the imprint material normally, and to hold the mold and the substrate by respective holding units (chucks) thereof (so-called dechucking).

To cope with this, Japanese Patent Laid-Open No. 2015-115370 proposes a technique of sensing (abnormality sensing) a state in which a mold is not separated from an imprint material on a substrate completely even after the completion of a mold separating operation, that is, a state in which the mold and the substrate are held by both holding units thereof. Furthermore, Japanese Patent Laid-Open No. 2013-70023 proposes a technique of controlling the orientation of a mold during a mold separating operation and suppressing occurrence of a pattern defect by independently switching ON/OFF of mold adsorption in each of a plurality of adsorption grooves.

Japanese Patent Laid-Open No. 2015-115370 discloses a technique of determining whether the mold is separated from the imprint material on the substrate by monitoring driving current values given to the holding units which hold the mold and the substrate during the mold separating operation. At this time, thresholds for determining whether the mold is separated from the imprint material on the substrate need to be set for the driving current values. The setting is difficult, however, because the thresholds vary depending on the states of the mold, the imprint material, the substrate, and the like.

Japanese Patent Laid-Open No. 2015-115370 also discloses a technique of determining, from an image obtained by capturing the surface of the substrate, whether the mold is separated from the imprint material on the substrate. In the technique, the surface on which the mold and the imprint material are in contact with each other is not observed directly, but the state of a distortion or warp is observed by capturing the surface of the substrate in its proximity. Therefore, the accuracy of a determination of whether the mold is separated is not necessarily high and further, a camera for capturing the surface of the substrate needs to be newly mounted in an imprint apparatus.

In Japanese Patent Laid-Open No. 2013-70023, ON/OFF of the mold adsorption by each adsorption groove is switched during the mold separating operation. This may temporarily decrease the adsorption force (holding state) of the mold and cause dechucking more easily.

Various states (types) exist in an abnormal state in which the mold is not separated from the imprint material normally, and a process of recovering to a normal state changes in accordance with the state. Therefore, not only sensing of the abnormal state in mold separation but also the classification of the types of the abnormal states is required recently.

SUMMARY OF THE INVENTION

The present invention provides an imprint apparatus advantageous in determining an abnormality in a mold separating operation.

According to one aspect of the present invention, there is provided an imprint apparatus which forms a pattern of an imprint material on a substrate by using a mold, the apparatus including a mold holding unit configured to hold the mold, a substrate holding unit configured to hold the substrate, an image capturing unit configured such that a field of view of the image capturing unit includes a pattern region of the mold held by the molding unit, and a control unit configured to determine, based on an image obtained by capturing at least one of the mold and the substrate by the image capturing unit after a mold separating operation for separating the mold from a cured imprint material on the substrate, whether an abnormality is generated in the mold separating operation.

Further aspects of the present invention will become apparent from the following description of exemplary embodiments with reference to the attached drawings.

BRIEF DESCRIPTION OF THE DRAWINGS

FIG. 8 is a table for explaining the process of determining whether an abnormality is generated in the mold separating operation.

DESCRIPTION OF THE EMBODIMENTS

Figure 1:
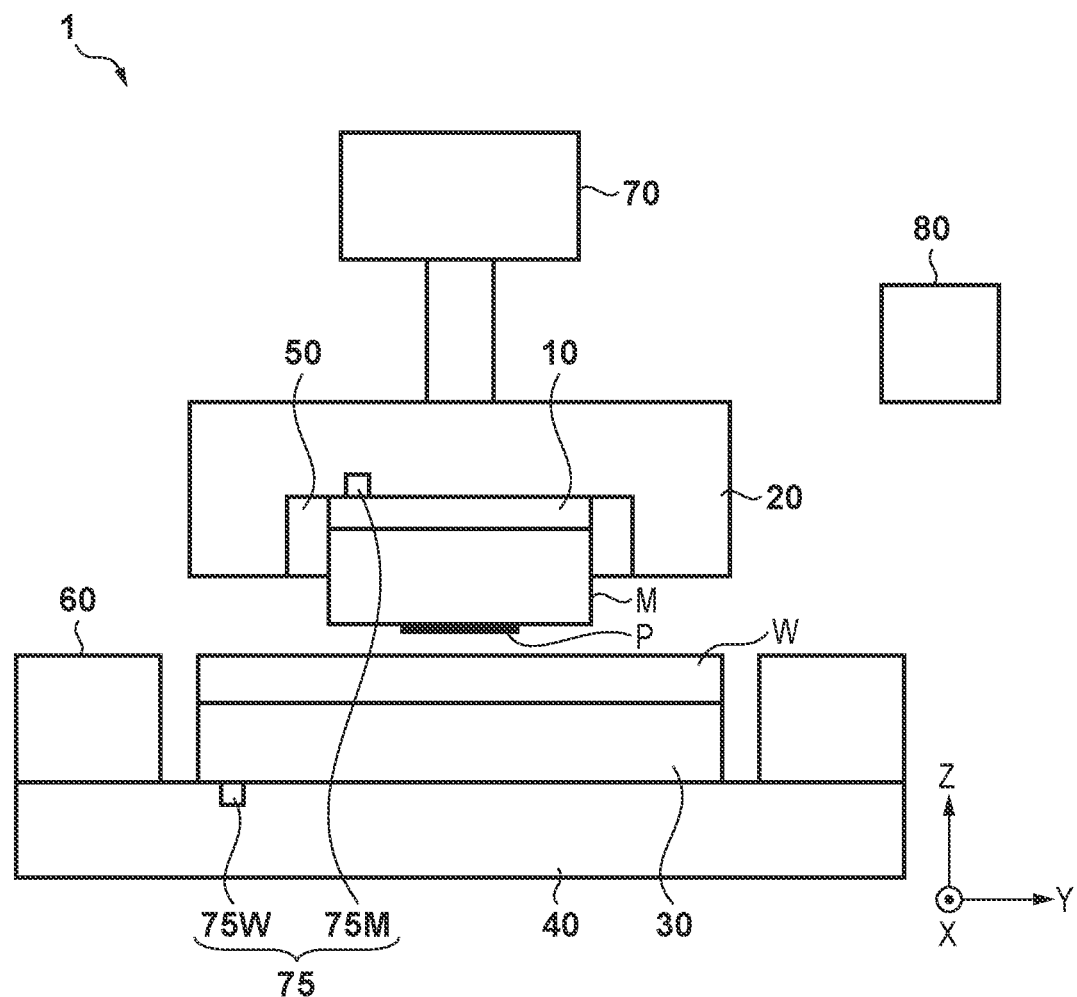
FIG. 1 is a schematic view showing the arrangement of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 1 according to an aspect of the present invention. The imprint apparatus 1 is a lithography apparatus which forms the pattern of an imprint material on a substrate by using a mold. In this embodiment, the imprint apparatus 1 brings the mold and the imprint material supplied onto the substrate into contact with each other, and applies curing energy to the imprint material, forming the pattern of a cured product to which the three-dimensional pattern of the mold has been transferred.

A curable composition (may also be referred to as an uncured resin) which is cured by receiving curing energy is used for the imprint material. An electromagnetic wave, heat, or the like is used as the curing energy. For example, light such as infrared light, visible rays, ultraviolet light, or the like whose wavelength is selected from a range of 10 nm (inclusive) to 1 mm (inclusive) is used as the electromagnetic wave.

The curable composition is a composition that is cured by light irradiation or application of heat. A photo-curable composition that is cured by light irradiation contains at least a polymerizable compound and a photopolymerization initiator, and may contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like.

The imprint material may be applied on the substrate in a film-like shape by a spin coater or a slit coater. Alternatively, a liquid injection head may apply, on the substrate, the imprint material having a droplet-like shape, or an island-like shape or a film-like shape formed by a plurality of droplets connected to each other. The viscosity (viscosity at 25° C.) of the imprint material is set at, for example, 1 mPa·s (inclusive) to 100 mPa·s (inclusive).

The imprint apparatus 1 includes a mold chuck 10 which holds a mold M, a head 20 which moves while holding the mold chuck 10, a substrate chuck 30 which holds a substrate W, and a substrate stage 40 which moves while holding the substrate chuck 30. The imprint apparatus 1 also includes a shape correction unit 50 which corrects the shape of a pattern region (a region in which a pattern has been formed) P of the mold M, a protective plate (flush plate) 60 which surrounds the substrate chuck 30, an image capturing unit 70, and a control unit 80.

The mold chuck 10 functions as a mold holding unit which holds the mold M by adsorption. The substrate chuck 30 functions as a substrate holding unit which holds the substrate W by adsorption. The substrate stage 40 positions the substrate W by moving the substrate chuck 30 in an X-axis direction and a Y-axis direction, and changes the portion (shot region) of the substrate W facing the mold M held by the mold chuck 10.

The shape correction unit 50 deforms the pattern region P of the mold M in accordance with the layer of the substrate W (a pattern formed on the substrate W). The protective plate 60 is arranged on the substrate stage 40 so as to reduce the displacement of the substrate W when the substrate W is held by the substrate chuck 30.

The image capturing unit 70 is configured (arranged) such that a field of view includes the pattern region P of the mold M held by the mold chuck 10, and obtains an image by capturing at least one of the mold M and the substrate W. In the imprint process, the image capturing unit 70 is a camera (spread camera) which observes a contact state between the mold M and the imprint material on the substrate.

Measurement units 75 have a function of measuring at least one of the adsorption pressure of the mold M by the mold chuck 10 and the adsorption pressure of the substrate W by the substrate chuck 30. In this embodiment, the measurement units 75 include a first measurement unit 75M and a second measurement unit 75W. The first measurement unit 75M measures the adsorption pressure of the mold M by detecting a pressure in an exhaust pipe provided in the mold chuck 10 in order to adsorb the mold M. The second measurement unit 75W measures the adsorption pressure of the substrate W by detecting a pressure in an exhaust pipe provided in the substrate chuck 30 in order to adsorb the substrate W.

The control unit 80 includes a CPU and a memory, and performs the imprint process by controlling the respective units of the imprint apparatus 1. The imprint process includes a supply process, a mold pressing process, a curing process, and a mold separating process. The supply process is a process of supplying the imprint material onto the substrate. The mold pressing process is a process of bringing the mold M and the imprint material on the substrate into contact with each other. The pattern region P (the concave portion of the pattern) of the mold M is filled with the imprint material on the substrate by bringing the mold M and the imprint material into contact with each other, that is, pressing the mold M against the imprint material. The curing process is a process of curing the imprint material on the substrate in a state in which the mold M and the imprint material are brought into contact with each other. The mold separating process is a process of separating the mold M from the cured imprint material on the substrate.

The imprint apparatus 1 also includes a sensor which detects the respective positions of the mold chuck 10 and the substrate chuck 30, and obtains position information. Further, the design reference position of the mold chuck 10 (mold M) and the substrate chuck 30 (substrate W) when the mold M and the imprint material on the substrate are brought into contact with each other is preset in the imprint apparatus 1. Therefore, the control unit 80 can sense, for example, whether the mold pressing process is in progress, whether the mold separating process is in progress, or the mold separating process is complete from the difference between the design reference position and the position information obtained by the sensor. In this embodiment, the mold pressing process or the mold separating process is performed by causing the head 20 to move the mold chuck 10 in a Z-axis direction (that is, to drive the mold chuck 10). It is therefore possible to sense that the mold separating process is performed when the position information of the mold chuck 10 is away from the design reference position and sense that the mold pressing process is performed when the position information is at the design reference position.

Figure 2A:
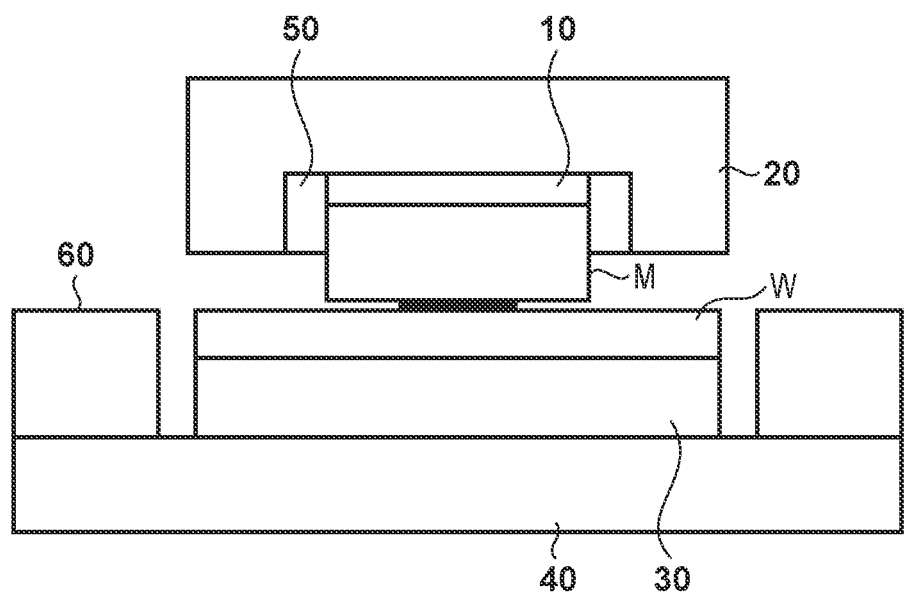
FIGS. 2A and 2B are views each showing a state of the imprint apparatus when an imprint process is performed normally.
Figure 2B:
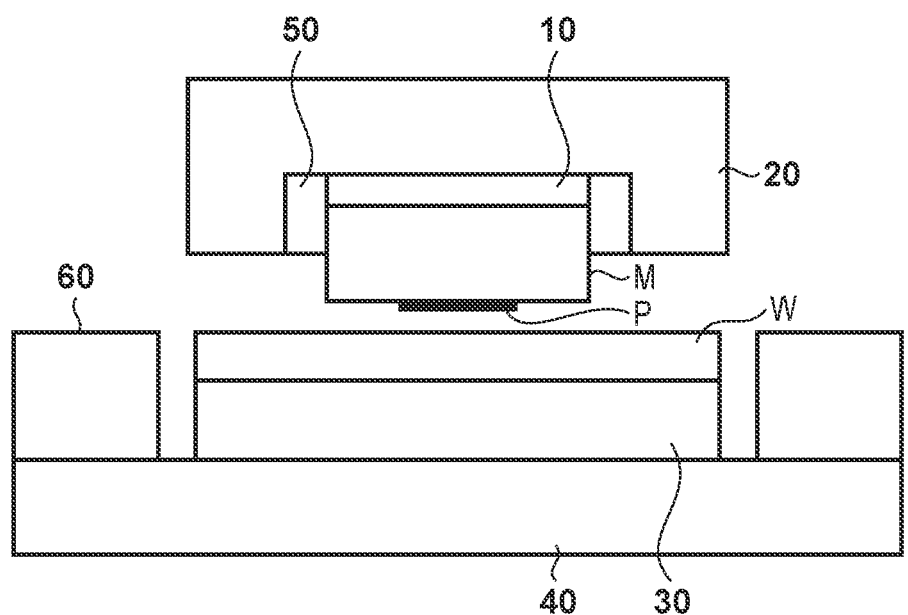

FIGS. 2A and 2B are views each showing the state of the imprint apparatus 1 when the imprint process is performed normally. FIG. 2A shows the positional relationship between the mold chuck 10 and the substrate chuck 30 in the mold pressing process. In this embodiment, the mold chuck 10 is moved downward to the design reference position with respect to the substrate chuck 30 (the substrate W held by), bringing the mold M into contact with the imprint material on the substrate, as shown in FIG. 2A. FIG. 2B shows the positional relationship between the mold chuck 10 and the substrate chuck 30 in the mold separating process. In this embodiment, the mold chuck 10 is moved upward with respect to the substrate chuck 30, separating the mold M from the imprint material on the substrate, as shown in FIG. 2B.

Figure 3:
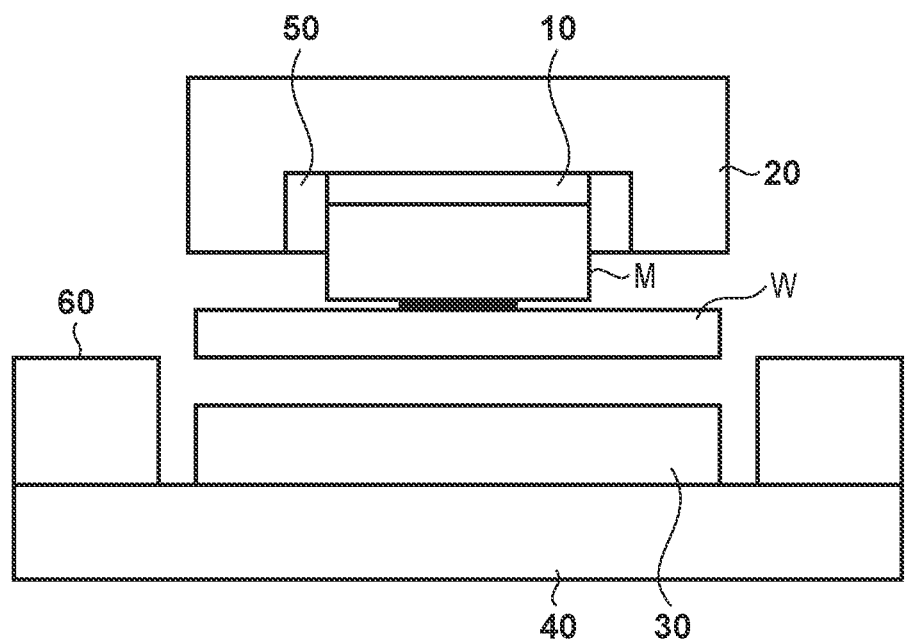
FIG. 3 is a view showing dechucking on a substrate side.

On the other hand, when the imprint process is not performed normally, an abnormality is generated in, for example, an operation regarding the mold separating process, that is, a mold separating operation for separating the mold M from the imprint material on the substrate in the mold separating process. The abnormality in the mold separating operation is typically dechucking which includes desorption of the mold M from the mold chuck 10 or desorption of the substrate W from the substrate chuck 30. FIG. 3 is a view showing a state in which the substrate chuck 30 cannot keep holding the substrate W, and the substrate W is desorbed from the substrate chuck 30, that is, dechucking on a substrate side. In the dechucking on the substrate side, if the mold chuck 10 moves upward toward a position at the end of mold separation, the substrate W is pulled by the mold M via the cured imprint material on the substrate, desorbed from the substrate chuck 30, and raised together with the mold M.

Figure 4:
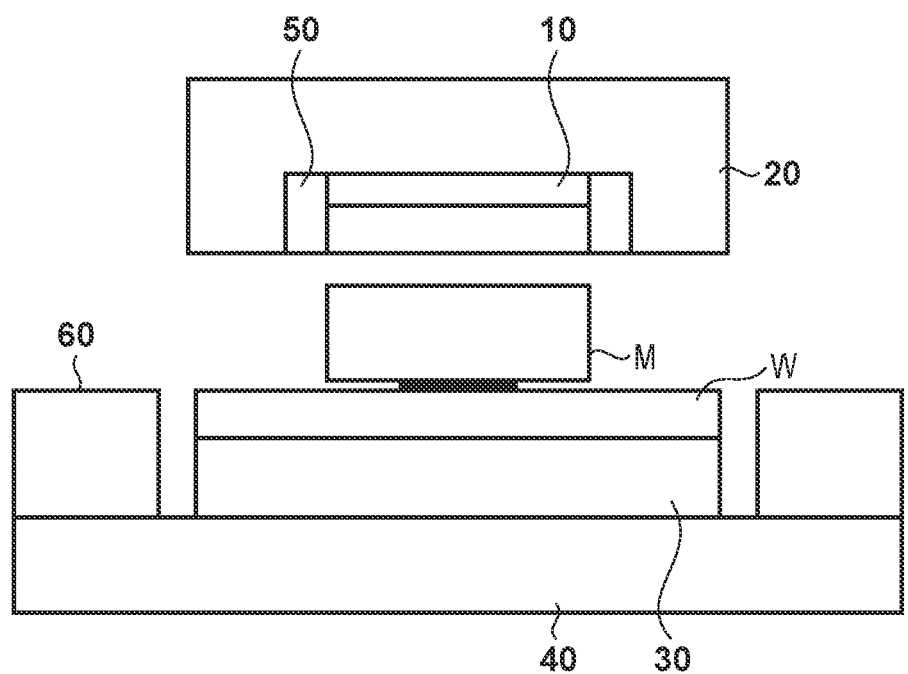
FIG. 4 is a view showing dechucking on a mold side.

FIG. 4 is a view showing a state in which the mold chuck 10 cannot keep holding the mold M, and the mold M is desorbed from the mold chuck 10, that is, dechucking on a mold side. In the dechucking on the mold side, if the mold chuck 10 moves upward toward the position at the end of mold separation, the mold M is pulled by the substrate W via the cured imprint material on the substrate, desorbed from the mold chuck 10, and remains in contact with the imprint material.

The dechucking shown in FIGS. 3 and 4 can be canceled by performing recovery processing for recovering to a normal state. It is possible to recover to the normal state by, for example, performing the mold separating operation of moving the mold chuck 10 downward to the design reference position and holding (absorbing) the substrate W by the substrate chuck 30 or the mold M by the mold chuck 10 again.

Figure 5:
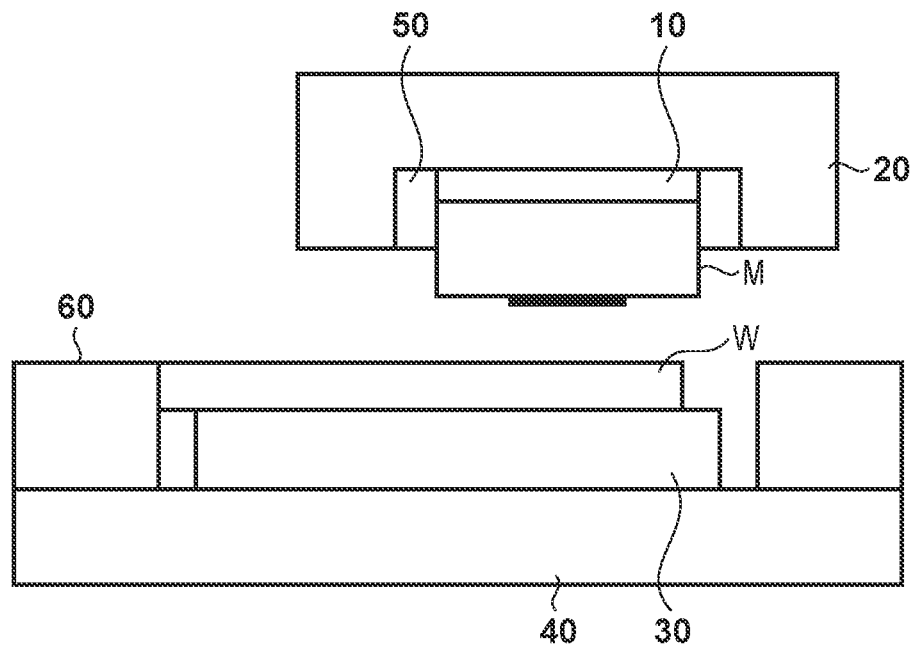
FIG. 5 is a view showing an example of an abnormality in holding of a substrate by a substrate chuck.
Figure 6:
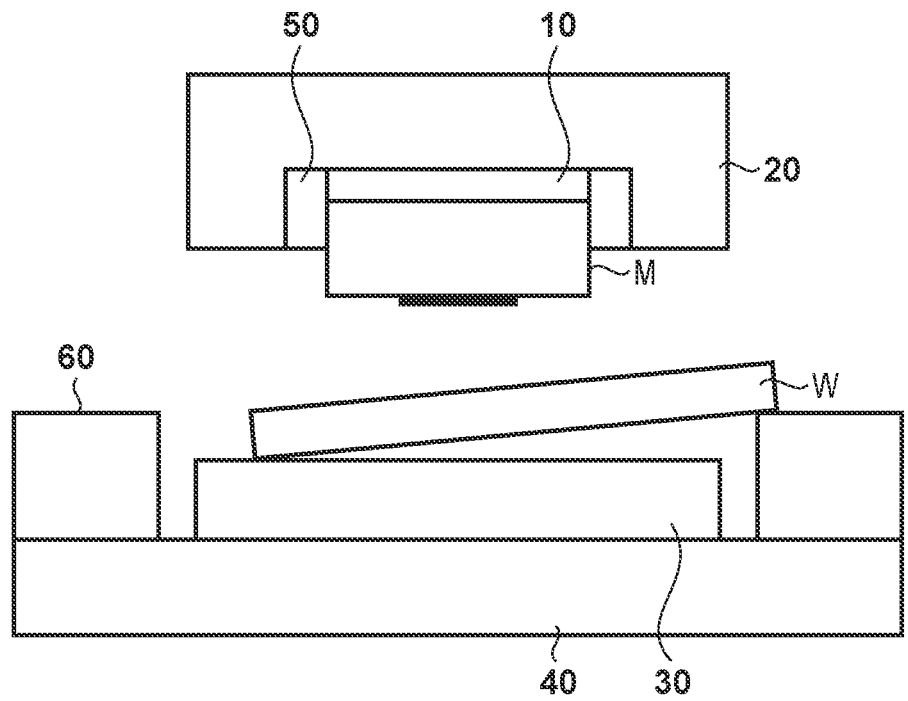
FIG. 6 is a view showing an example of an abnormality in holding of the substrate by the substrate chuck.

The abnormality in the mold separating operation includes not only dechucking but also abnormalities in holding of the substrate W by the substrate chuck 30 as shown in FIGS. 5 and 6. FIG. 5 shows a state in which the substrate W is displaced from a reference position and held by the substrate chuck 30, that is, a state in which a displacement is generated in the substrate W held by the substrate chuck 30. Referring to FIG. 5, it seems that the mold separating operation is performed normally. However, the position of the substrate W in the substrate chuck 30 is displaced in the X-axis direction and the Y-axis direction. If the imprint process is performed continuously in this state, a deviation between the pattern of the mold M and the layer of the substrate W increases, making the displacement of the substrate W held by the substrate chuck 30 one of abnormalities in the mold separating operation. The displacement of the substrate W in the substrate chuck 30 is often generated in the recovery processing for recovering the dechucking on the substrate side shown in FIG. 3 to the normal state. The displacement of the substrate W is generated when, for example, causing the substrate chuck 30 to hold (absorb) the substrate W desorbed from the substrate chuck 30 again.

FIG. 6 shows a state in which the substrate W rides over the protective plate 60 and is held by the substrate chuck 30, that is, a state in which the riding of the substrate W over the protective plate 60 is generated. The imprint process cannot be performed continuously in this state, making the riding of the substrate W over the protective plate 60 one of the abnormalities in the mold separating operation. The riding of the substrate W over the protective plate 60 is often generated from the dechucking on the substrate side shown in FIG. 3. The riding of the substrate W over the protective plate 60 is generated by, for example, dropping the substrate W desorbed from the substrate chuck 30 and raised in an unstable state together with the mold M.

The abnormalities in holding of the substrate W by the substrate chuck 30 as shown in FIGS. 5 and 6 cannot be canceled by the recovery processing for the dechucking as shown in FIGS. 3 and 4. For example, in the state in which the displacement is generated in the substrate W held by the substrate chuck 30 as shown in FIG. 5, the pattern of the imprint material formed on the substrate may be damaged if the mold chuck 10 is moved down to the design reference position. In the state in which the substrate W rides over the protective plate 60 as shown in FIG. 6, the mold M and the substrate W may interfere with each other, and be damaged if the mold chuck 10 is moved down to the design reference position. It is therefore necessary to perform, on the abnormalities in holding of the substrate W by the substrate chuck 30 as shown in FIGS. 5 and 6, recovery processing in such a way that the imprint apparatus 1 (imprint process) is stopped, and the mold M or the substrate W is recovered manually.

It is therefore necessary, in the imprint apparatus 1, to accurately determine whether an abnormality is generated in the mold separating operation after the mold separating process is performed in order to avoid the imprint process from being performed continuously in a state in which the abnormality is generated in the mold separating operation. As described above, the recovery processing for recovering to the normal state changes depending on the type of abnormality (dechucking, the abnormality in holding of the substrate W by the substrate chuck 30, and the like) in the mold separating operation. Therefore, in addition to determining whether the abnormality is generated in the mold separating operation, it also becomes necessary to classify a specific abnormality generated, that is, the type of abnormality in the mold separating operation. However, the related art lacks the accuracy of a determination of whether the abnormality is generated in the mold separating operation and further cannot classify the type of abnormality in the mold separating operation.

To cope with this, in this embodiment, the control unit 80 determines, based on the image obtained by capturing at least one of the mold M and the substrate W with the image capturing unit 70 after the mold separating operation is performed, whether the abnormality is generated in the mold separating operation. In addition, if the control unit 80 determines that the abnormality is generated in the mold separating operation, it classifies the abnormalities in the mold separating operation based on the adsorption pressure measured by the measurement units 75 and the image obtained by the image capturing unit 70 after the mold separation operation is performed.

Figure 7:
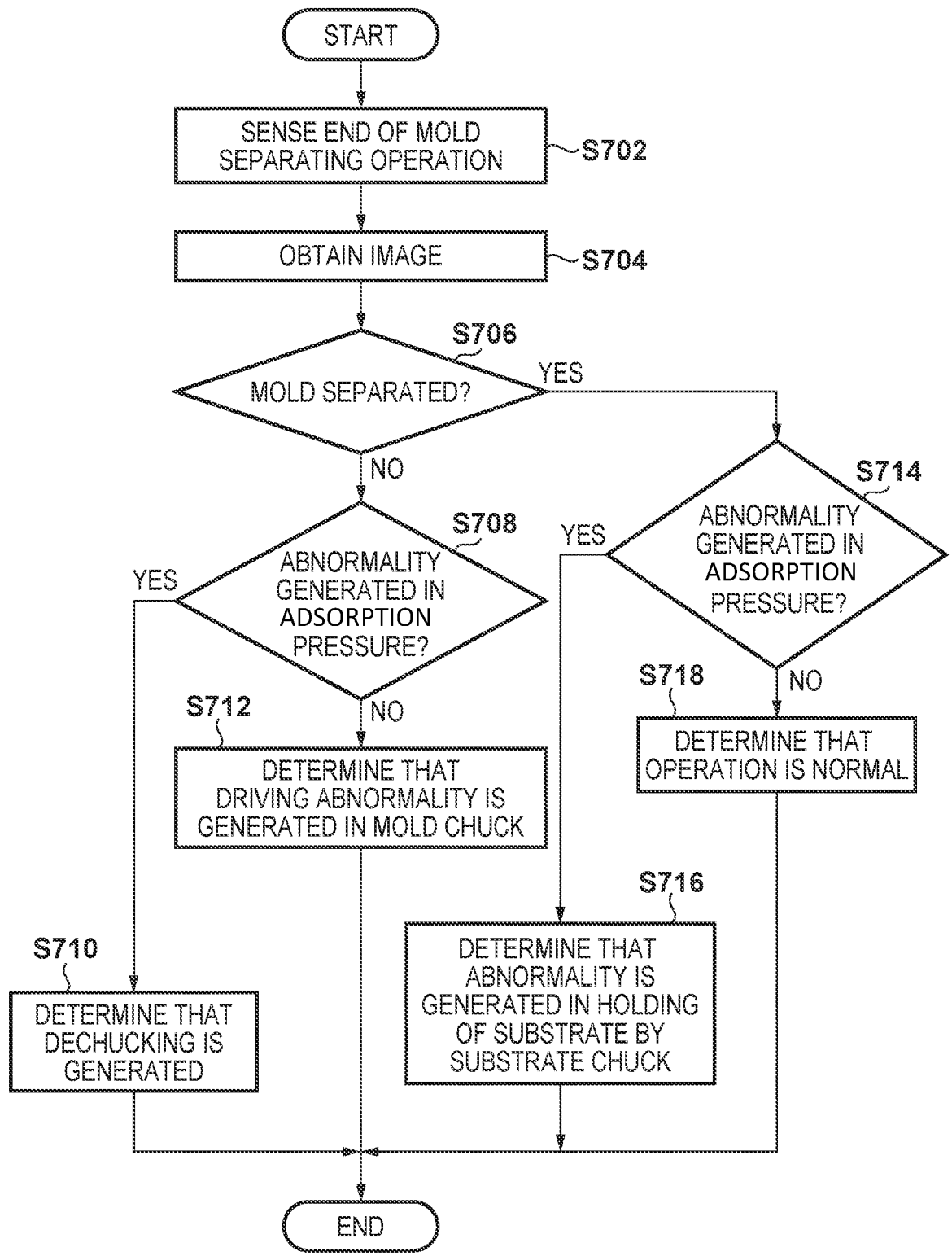
FIG. 7 is a flowchart for explaining a process of determining whether an abnormality is generated in a mold separating operation.

A process of determining whether an abnormality in the mold separating operation is generated in the imprint apparatus 1 will be described with reference to FIG. 7. The process is performed by causing the control unit 80 to generally control the respective units of the imprint apparatus 1 and is performed before a shot region to undergo the imprint process is moved from a certain shot region to a next shot region.

In step S702, the end of the mold separating operation for separating the mold M from the cured imprint material on the substrate is sensed. The end of the mold separating operation can be sensed by comparing the position information of the mold chuck 10 with the design reference position as described above.

In step S704, using sensing of the end of the mold separating operation in step S702 as a trigger, the image capturing unit 70 obtains an image by capturing the mold M and the substrate W in a state after the mold separating operation is performed. Note that in general, the image capturing unit 70 always captures the mold M and the substrate W while the imprint process is performed, and accumulates (stores) the image in a storage unit of the imprint apparatus 1. Therefore, in step S704, the image captured by the image capturing unit 70 when the end of the mold separating operation is sensed may be obtained from the storage unit instead of newly capturing the mold M and the substrate W by the image capturing unit 70.

In step S706, it is determined, based on the image obtained in step S704, whether the mold M is separated from the cured imprint material on the substrate. It is possible to determine, from the brightness of the image obtained in step S704, whether the mold M is separated from the cured imprint material on the substrate. When the mold M is separated from the cured imprint material on the substrate, the mold M and the substrate W are spaced apart from each other, and light enters a space between them, making the image obtained by the image capturing unit 70 bright. It is therefore possible to determine that the mold M is separated from the cured imprint material on the substrate if the image obtained in step S704 is brighter than a reference. On the other hand, if the mold M is not separated from the cured imprint material on the substrate, the mold M and the substrate W are not spaced apart from each other, that is, the space does not exist between the mold M and the substrate W, and the light does not enter, making the image obtained by the image capturing unit 70 dark. It is therefore possible to determine that the mold M is not separated from the cured imprint material on the substrate if the image obtained in step S704 is darker than the reference.

In step S706, if it is determined that the mold M is not separated from the cured imprint material on the substrate, the process advances to step S708. On the other hand, if it is determined that the mold M is separated from the cured imprint material on the substrate, the process advances to step S714.

In step S708, an adsorption pressure measured by the measurement units 75 after the mold separating operation is performed is obtained and it is determined whether an abnormality is generated in the adsorption pressure. It is possible to determine whether the abnormality is generated in the adsorption pressure by comparing the adsorption pressure measured by the measurement units 75 with a reference adsorption pressure (for example, an adsorption pressure when the mold chuck 10 absorbs the mold M or an adsorption pressure when the substrate chuck 30 absorbs the substrate W). If it is determined that the abnormality is generated in the adsorption pressure, the process advances to step S710. On the other hand, if it is determined that the abnormality is not generated in the adsorption pressure, the process advances to step S712.

In step S710, it is determined that dechucking is generated as an abnormality in the mold separating operation. In other words, if the brightness of the image obtained in step S704 is lower than the reference, and the adsorption pressure has the abnormality, it is determined that the dechucking on the substrate side as shown in FIG. 3 or the dechucking on the mold side as shown in FIG. 4 is generated. In step S710, it may further be determined whether an abnormality is generated in an adsorption pressure measured by the first measurement unit 75M or an abnormality is generated in an adsorption pressure measured by the second measurement unit 75W. If the abnormality is generated in the adsorption pressure measured by the first measurement unit 75M, it is considered that the mold M is desorbed from the mold chuck 10, making it possible to determine that the dechucking is generated on the mold side. If the abnormality is generated in the adsorption pressure measured by the second measurement unit 75W, it is considered that the substrate W is desorbed from the substrate chuck 30, making it possible to determine that the dechucking is generated on the substrate side. It is thus possible to determine on which of the substrate side and the mold side the dechucking is generated.

In step S712, it is determined that an abnormality is generated in the driving control of the mold chuck 10 as an abnormality in the mold separating operation. In other words, if the brightness of the image obtained in step S704 is lower than the reference, and the adsorption pressure has no abnormality, it is considered that, for example, no change is made from the state (mold pressing process) shown in FIG. 2A, and it is thus determined that the abnormality is generated in the driving control of the mold chuck 10. Note that in this embodiment, the mold pressing process or the mold separating process is performed by driving the mold chuck 10, it is thus determined in step S712 that the abnormality is generated in the driving control of the mold chuck 10. However, if the mold pressing process or the mold separating process is performed by driving the substrate chuck 30, it is determined in step S712 that an abnormality is generated in the driving control of the substrate chuck 30. Alternatively, if the mold pressing process or the mold separating process is performed by driving both the mold chuck 10 and the substrate chuck 30, it is determined in step S712 that an abnormality is generated in the driving control of at least one of the mold chuck 10 and the substrate chuck 30.

In step S714, an adsorption pressure measured by the measurement units 75 after the mold separating operation is performed is obtained, and it is determined whether an abnormality is generated in the adsorption pressure, as in step S708. If it is determined that the abnormality is generated in the adsorption pressure, the process advances to step S716. On the other hand, if it is determined that the abnormality is not generated in the adsorption pressure, the process advances to step S718.

In step S716, it is determined that an abnormality is generated in holding of the substrate W by the substrate chuck 30 as an abnormality in the mold separating operation. In other words, if the brightness of the image obtained in step S704 is higher than the reference, and the adsorption pressure has the abnormality, it is determined that the displacement of the substrate W in the substrate chuck 30 as shown in FIG. 5 or the riding of the substrate W over the protective plate 60 as shown in FIG. 6 is generated.

In step S718, it is determined that the mold separating operation is normal. In other words, if the brightness of the image obtained in step S704 is higher than the reference, and the adsorption pressure has no abnormality, it is determined that the abnormality is not generated in the mold separating operation.

As described above, in this embodiment, it is determined, based on the image obtained by the image capturing unit 70 capable of capturing the surface on which the mold M and the imprint material are in contact with each other, whether the abnormality is generated in the mold separating operation, making it possible to make the determination accurately. If the abnormality is generated in the mold separating operation, it is also possible to classify the type of abnormality.

In this embodiment, the process of sequentially determining whether the abnormality is generated in the mold separating operation and the type of abnormality generated in the mold separating operation has been described. However, the present invention is not limited to this. For example, the control unit 80 may collectively determine whether the abnormality is generated in the mold separating operation and the type of abnormality by using information indicating the relationship between the abnormalities (type thereof) in the mold separating operation, and the image obtained by the image capturing unit 70 and the adsorption pressure measured by the measurement units 75, as shown in FIG. 8. The information needs to be stored in advance in, for example, the memory of the control unit 80.

In this embodiment, if the abnormality is generated in the mold separating operation, it is possible to classify the type of abnormality, as described above. Therefore, if the abnormality in the mold separating operation is, for example, the dechucking (see FIGS. 3 and 4), the recovery processing for canceling the dechucking and recovering to the normal state can be performed automatically under the control of the control unit 80. Note that the recovery processing is as described above, and thus a detailed description thereof will be omitted here. If the abnormality in the mold separating operation is, for example, the abnormality in holding of the substrate W by the substrate chuck 30 (see FIGS. 5 and 6), the control unit 80 stops the imprint process. Then, the control unit 80 notifies the user of a message which prompts for manual recovery of the mold M or the substrate W.

The pattern of the cured product that has been formed using the imprint apparatus 1 is used permanently for at least some of various articles or used temporarily when the various articles are manufactured. The article includes an electric circuit element, an optical element, a MEMS, a printing element, a sensor, a die, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The die includes an imprinting mold or the like.

The pattern of the cured product is used without any change as a constituent member of at least a part of the above-described article or used temporarily as a resist mask. The resist mask is removed after etching, ion implantation, or the like is performed in a processing step of the substrate.

Figure 9A:
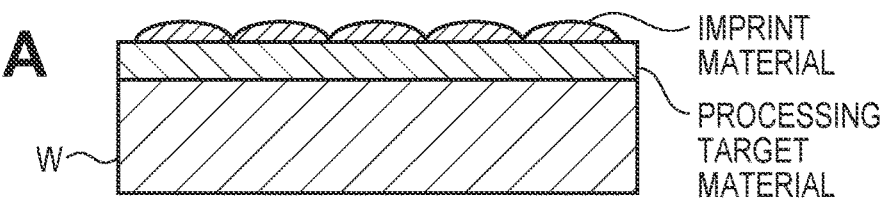
FIGS. 9A to 9F are views for explaining a method of manufacturing an article.

A detailed method of manufacturing the article will now be described. As shown FIG. 9A, the substrate W such as a silicon wafer having a processing target material such as an insulator formed on its surface is prepared, and then an imprint material is applied on the surface of the processing target material by an inkjet method or the like. A state is shown here in which the imprint material formed into a plurality of droplets is applied on the substrate.

Figure 9B:
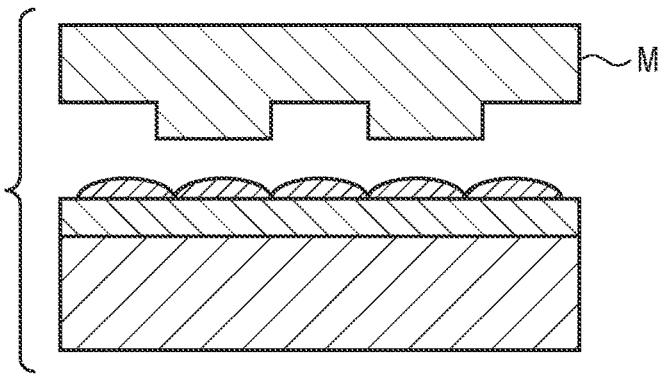
Figure 9C:
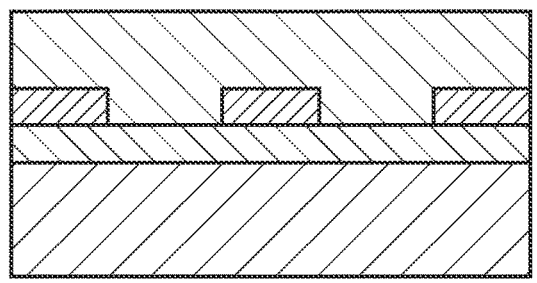

As shown in FIG. 9B, a side of the imprinting mold M on which its three-dimensional pattern is formed faces the imprint material on the substrate. As shown in FIG. 9C, the mold M and the substrate W to which the imprint material is applied are brought into contact with each other, applying a pressure. The imprint material fills the gap between the mold M and the processing target material. The imprint material is cured by irradiating it with light as curing energy through the mold M in this state.

Figure 9D:
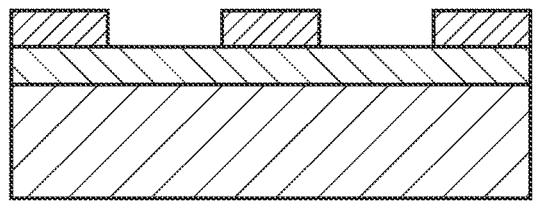

As shown in FIG. 9D, the pattern of the cured product of the imprint material is formed on the substrate by separating the mold M and the substrate W from each other after curing the imprint material. The pattern of this cured product has a shape such that the concave portion of the mold M corresponds to the convex portion of the cured product, and the convex portion of the mold M corresponds to the concave portion of the cured product. That is, the three-dimensional pattern of the mold M is transferred to the imprint material.

Figure 9E:
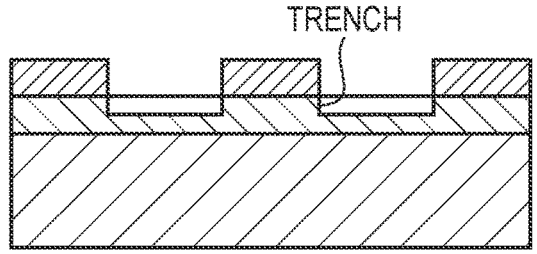
Figure 9F:
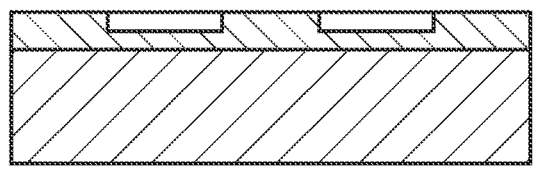

As shown in FIG. 9E, out of the surface of the processing target material, portions without the cured product or portions where the cured products remain thin are removed and become trenches by performing etching using the pattern of the cured product as an etching resistant mask. As shown in FIG. 9F, an article having the trenches formed on the surface of the processing target material can be obtained by removing the pattern of the cured product. The pattern of the cured product is removed here. However, the pattern of the cured product may be utilized as, for example, an interlayer dielectric film included in the semiconductor element or the like, that is, the constituent member of the article without removing it even after processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2016-137957 filed on Jul. 12, 2016, which is hereby incorporated by reference herein in its entirety.

What is claimed is:

1. An imprint apparatus which forms a pattern of an imprint material on a substrate by using a mold, the apparatus comprising:
 a mold holding unit configured to hold the mold by adsorption;
 a substrate holding unit configured to hold the substrate by adsorption;
 an image capturing unit configured such that a field of view of the image capturing unit includes a pattern region of the mold held by the mold holding unit, wherein the image capturing unit is arranged so as to be capable of capturing an image of a surface on which the mold and the imprint material are in contact with each other during a mold pressing operation;
 a measurement unit configured to measure at least one of an adsorption pressure of the mold by the mold holding unit and an adsorption pressure of the substrate by the substrate holding unit; and
 a control unit configured to determine, based on an image captured by the image capturing unit and the adsorption pressure measured by the measurement unit after a mold separating operation for separating the mold from a cured imprint material on the substrate, whether the mold is separated from the cured imprint material on the substrate in the mold separating operation, wherein in a case where the mold separating operation is not normally performed, the control unit classifies, based on the image captured by the image capturing unit and the adsorption pressure measured by the measurement unit after the mold separating operation is performed, a type of abnormality from among three or more types of abnormalities in the mold separating operation.

2. The apparatus according to claim 1, wherein the control unit determines that the mold is not separated from the cured imprint material on the substrate if brightness of the image is lower than a reference.

3. The apparatus according to claim 1, wherein the control unit determines that an abnormality is generated in driving control of at least one of the mold holding unit and the substrate holding unit if brightness of the image is lower than a reference, and the adsorption pressure measured by the measurement unit after the mold separating operation is performed has no abnormality,
  determines that dechucking is generated which includes one of desorption of the mold from the mold holding unit and desorption of the substrate from the substrate holding unit if the brightness of the image is lower than the reference, and the adsorption pressure measured by the measurement unit after the mold separating operation is performed has an abnormality,
  determines that an abnormality is not generated in the mold separating operation if the brightness of the image is higher than the reference, and the adsorption pressure measured by the measurement unit after the mold separating operation is performed has no abnormality, and
  determines that an abnormality is generated in holding of the substrate by the substrate holding unit if the brightness of the image is higher than the reference, and the adsorption pressure measured by the measurement unit after the mold separating operation is performed has an abnormality.

4. The apparatus according to claim 3, wherein the control unit determines that the desorption of the mold from the mold holding unit is generated if the brightness of the image is lower than the reference, and the adsorption pressure of the mold measured by the measurement unit after the mold separating operation is performed has an abnormality, and
  determines that the desorption of the substrate from the substrate holding unit is generated if the brightness of the image is lower than the reference, and the adsorption pressure of the substrate measured by the measurement unit after the mold separating operation is performed has an abnormality.

5. The apparatus according to claim 3, wherein the abnormality in holding of the substrate by the substrate holding unit includes one of displacement of the substrate held by the substrate holding unit and riding of the substrate over a protective plate which surrounds the substrate holding unit.

6. The apparatus according to claim 3, wherein if the control unit determines that dechucking is generated as an abnormality in the mold separating operation, the control unit automatically performs recovery processing for canceling the dechucking.

7. The apparatus according to claim 3, wherein the control unit stops an imprint process of forming the pattern if the control unit determines that the abnormality is generated in holding of the substrate by the substrate holding unit as an abnormality in the mold separating operation.

8. The apparatus according to claim 7, wherein the control unit notifies a user that the abnormality is generated in holding of the substrate by the substrate holding unit.

9. A method of manufacturing an article, the method comprising:
  forming a pattern on a substrate using an imprint apparatus; and
  processing the substrate on which the pattern has been formed,
  wherein the imprint apparatus forms a pattern of an imprint material on the substrate by using a mold, and includes:
  a mold holding unit configured to hold the mold by adsorption;
  a substrate holding unit configured to hold the substrate by adsorption;
  an image capturing unit configured such that a field of view of the image capturing unit includes a pattern region of the mold held by the mold holding unit, wherein the image capturing unit is arranged so as to be capable of capturing an image of a surface on which the mold and the imprint material are in contact with each other during a mold pressing operation;
  a measurement unit configured to measure at least one of an adsorption pressure of the mold by the mold holding unit and an adsorption pressure of the substrate by the substrate holding unit; and
  a control unit configured to determine, based on an image captured by the image capturing unit and adsorption pressure measured by the measurement unit after a mold separating operation for separating the mold from a cured imprint material on the substrate, whether the mold is separated from the cured imprint material on the substrate in the mold separating operation,
  wherein in a case where the mold separating operation is not normally performed, the control unit classifies, based on the image captured by the image capturing unit and the adsorption pressure measured by the measurement unit after the mold separating operation is performed, a type of abnormality from among three or more types of abnormalities in the mold separating operation.

10. The apparatus according to claim 1, wherein after classifying the type of abnormality in the mold separating operation, the control unit controls to perform an operation according to the type of abnormality.

* * * * *